US006566820B2

(12) United States Patent
Kim et al.

(10) Patent No.: US 6,566,820 B2

(45) Date of Patent: May 20, 2003

(54) PIEZOELECTRIC TRANSFORMER WITH MULTIPLE OUTPUTS

(75) Inventors: Jong-Sun Kim, Suwon (KR); Jang-Hyoun Youm, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/893,828

(22) Filed: Jun. 28, 2001

(65) Prior Publication Data

US 2003/0001514 A1 Jan. 2, 2003

(51) Int. Cl.[7] .......................... H07B 37/20; H01L 41/04

(52) U.S. Cl. ................................ 315/209 PZ; 310/357; 310/366

(58) Field of Search .................... 315/209 PZ; 310/357, 310/359, 366, 368, 367, 328, 369, 371

(56) References Cited

U.S. PATENT DOCUMENTS

| | | | | |
|---|---|---|---|---|
| 5,698,930 A | * | 12/1997 | Takagi | 310/321 |
| 5,892,318 A | | 4/1999 | Dai et al. | 310/358 |
| 5,929,554 A | * | 7/1999 | Kanayama et al. | 310/359 |
| 6,140,747 A | * | 10/2000 | Saito et al. | 310/328 |
| 6,188,163 B1 | * | 2/2001 | Danov | 310/316.01 |
| 6,278,227 B1 | * | 8/2001 | Katsuno et al. | 310/359 |
| 6,297,878 B1 | * | 10/2001 | Miller | 310/311 |
| 2001/0054704 A1 | * | 12/2001 | Kim et al. | 252/62.9 PZ |

* cited by examiner

*Primary Examiner*—Don Wong
*Assistant Examiner*—Trinh Vo Dinh
(74) *Attorney, Agent, or Firm*—Renner, Otto, Boisselle & Sklar, LLP

(57) ABSTRACT

A piezoelectric transformer with multiple outputs comprises a piezoelectric plate, a first input electrode being formed on the top surface of the piezoelectric plate, a second input electrode being formed on the bottom surface of the piezoelectric plate, a plurality of first output electrodes being electrically isolated from each other, being formed on the equally divided remaining portions of the top surface of the plate along a diagonal line, and a second output electrode formed on the remaining portions of the bottom surface of the plate, thereby providing a stabilizer for lighting lamps without a ballast capacitor by supplying a regular voltage to more than two fluorescent lamps.

5 Claims, 8 Drawing Sheets

PIEZOELECTRIC TRANSFORMER WITH MULTIPLE OUTPUTS

BACKGROUND OF THE INVENTION

Field of the Invention

The present invention relates to piezoelectric transformers, and more particularly to a piezoelectric transformer with multiple outputs comprising a plurality of output terminals in a fluorescent lamps stabilizer, which supplies stable voltages to more than two fluorescent lamps without a ballast capacitor.

BACKGROUND OF THE INVENTION

Generally, a fluorescent lamp, which is a sort of a discharge tube, requires a high voltage at primary lighting in order to emit thermal electrons for an electric discharge. After electric discharge, a voltage supplied to a fluorescent lamp decreases according to an increment of current. Namely, the voltage has a negative resistance characteristic.

A stabilizer of fluorescent lamp, which is a lighting lamp device, supplies a high voltage to the fluorescent lamp with the characteristic above for lighting the lamp at primary time, and keeps a regular luminosity by controlling a current of the lamp after the lighting.

Referring to FIG. 6, FIG. 6 illustrates a general block diagram of configuration of a stabilizer of fluorescent lamp. As shown in FIG. 6, A fluorescent lamp stabilizer comprises a rectifying section 621 for rectifying from AC commercial supply voltage 61 into a DC voltage of some level, a power factor compensating section 622 for compensating the power factor to the output of the rectifying section 621, which is generated by the fluctuation of the AC commercial supply voltage 61, an AC voltage generating section 623 for converting a uniform DC current inputted from the power factor compensating section 622 to AC voltage having a high frequency, and a resonating section 624 for outputting the AC voltage to the fluorescent lamp 63 by resonating the output voltage of the AC voltage generating section 623. The AC voltage generating section 623 is called a inverter.

Typically, the resonating section 624 was formed to generate a resonance by an inductance of a wound-type transformer and capacitance of the capacitor by connecting the capacitor to the wound-type transformer. However, the wound-type transformer has problems that a defective proportion is high because of the material declination of core, and confidence of the stabilizer is lower. So a piezoelectric transformer is on an increasing trend instead of a wound-type transformer currently. The example above is the case that a fluorescent lamp is connected to a stabilizer However, in case of lighting more than two fluorescent lamps by connecting the fluorescent lamps into one stabilizer, if one of numerous fluorescent lamps is lighted, other fluorescent lamps connected to the wound-type transformer in parallel is not lighted because a lower voltage is supplied to the other fluorescent lamps by lighting the one fluorescent lamp.

Accordingly, typically FIG. 7 and FIG. 8 depict more than two fluorescent lamps connected a stabilizer. As shown in FIG. 7 and FIG. 8, each ballast capacitor (713,813) is connected between lamps (72,82) and transformers (712, 812), although one of the fluorescent lamps is lighted fist, a voltage required for lighting the lamps at primary time can be supplied to other fluorescent lamps.

FIG. 7 and FIG. 8 illustrate a perspective view of a typical fluorescent lamp stabilizer with a plurality of fluorescent lamps. As shown in FIG. 7, the fluorescent lamp stabilizer for a plurality of fluorescent lamps having a piezoelectric transformer comprises a circuit section 711, which includes the rectifying section 621, the power compensating section 622, the AC voltage generating section 623, and the resonance capacitor of the resonating section 624, the piezoelectric transformer 712 of which input electrode is connected to the resonance capacitor of the circuit section 711, and a plurality of ballast capacitors 713 being connected to output electrode of the piezoelectric transformer 712 in parallel. Wherein the number of ballast capacitors is same that of lamps. Furthermore, a plurality of fluorescent lamps 72 are connected to other terminal of the plurality of ballast capacitors 713 of the stabilizer 71 respectively.

As shown in FIG. 8, the stabilizer for a plurality of fluorescent lamps having a wound-type transformer comprises a circuit section 811, which includes the rectifying section 621, the power compensating section 622, the AC voltage generating section 623, and the resonance capacitor of the resonating section 624. And the stabilizer comprises the wound-type transformer 812 of which input electrode is connected to a resonance capacitor of the circuit section 811, and a plurality of ballast capacitors 813 being connected to output electrode of the wound-type transformer 812 in parallel. Furthermore, the plurality of fluorescent lamps 82 are connected to other terminal of the plurality of ballast capacitors 713 of the stabilizer 71 respectively.

In the stabilizer above, because AC voltage supplied by the wound-type transformer 712 or the piezoelectric transformer 812 is divided equally among the plurality of fluorescent lamps via the ballast capacitor 713,813, the plurality of fluorescent lamps can be lighted at the same time. Wherein the ballast capacitor 713,813 has a high withstand voltage characteristic, and its size is also big.

Accordingly, as shown in FIG. 7 or FIG. 8, because the stabilizer needs the ballast capacitors in proportion to the number of the connected fluorescent lamp, a volume and the number of components increase, and a cost increases also.

The present invention offers a piezoelectric transformer with multiple outputs for lighting a plurality of fluorescent lamps stably without a ballast capacitor by comprising a plurality of output electrode having a regular output characteristic.

Moreover, the present invention provides a piezoelectric transformer with multiple outputs for causing a cost saving and a simple working of a stabilizer for a plurality of fluorescent lamps by comprising a plurality of output electrode having a regular output characteristic.

SUMMARY OF THE INVENTION

The present invention relates to piezoelectric transformers, and more particularly to a piezoelectric transformer with multiple outputs, which impresses stable voltages into a plurality of fluorescent lamps without a ballast capacitor in a fluorescent lamp stabilizer.

According to the present invention, the piezoelectric transformer with multiple outputs comprises a piezoelectric plate, a first input electrode being formed on the top surface of the piezoelectric plate, a second input electrode being formed on the bottom surface of the piezoelectric plate, a plurality of first output electrodes being electrically isolated from each other, which is formed by dividing the remaining portions of the top surface of the plate excluding the surface on which the first input electrode is formed, and a second output electrode formed in the remaining portions of the bottom surface of the plate excluding the surface on which the second input electrode is formed, which is disposed at a confronting position of the plurality of first output electrode.

In case of forming a stabilizer for a plurality of fluorescent lamps, the first input electrode and second input electrode are connected to a AC voltage generator of the stabilizer, the first output electrode is connected to one terminal of more than two fluorescent lamps one to one respectively, and the other terminals of the fluorescent lamps are connected to the second output electrode in parallel.

So the present invention provides a stabilizer for lighting a plurality of lamps without a ballast capacitor by supplying a regular voltage to more than two fluorescent lamps.

DESCRIPTION OF THE PREFERRED EMBODIMENT

The present invention can be best understood with reference to FIGS. 1~5.

Figure 1:
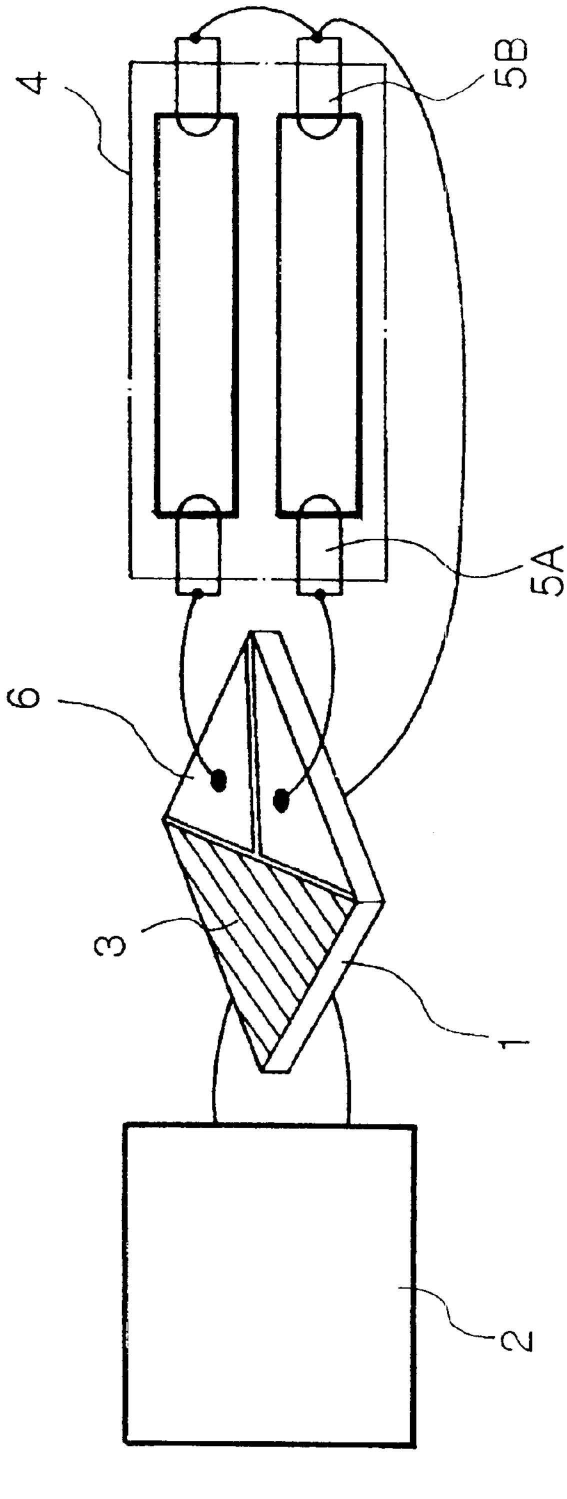
FIG. 1 shows a perspective view of an embodiment of a piezoelectric transformer and a lighting device for two lamps having it in accordance with the present invention.

FIG. 1 illustrates a perspective view of an embodiment of a piezoelectric transformer and a lighting device with two lamps having it in accordance with the present invention, FIG. 2 illustrates a plane view of a top and bottom surface of an embodiment of the piezoelectric transformer with multiple outputs in accordance with the present invention, and FIGS. 3, 4 and 5 illustrates a plane view of a top and bottom surface of another embodiment of the piezoelectric transformer with multiple outputs in accordance with the present invention respectively.

The piezoelectric transformer in accordance with the present invention is formed to printing input electrodes and a plurality of output electrodes divided equally on the top and bottom surface.

And the input electrode is connected to the circuit section 2, and then receives an supplied AC voltage. The output electrode is connected to the fluorescent lamp, and then output an AC voltage. These input electrode and output electrode form a variety of shape.

Figure 2A:
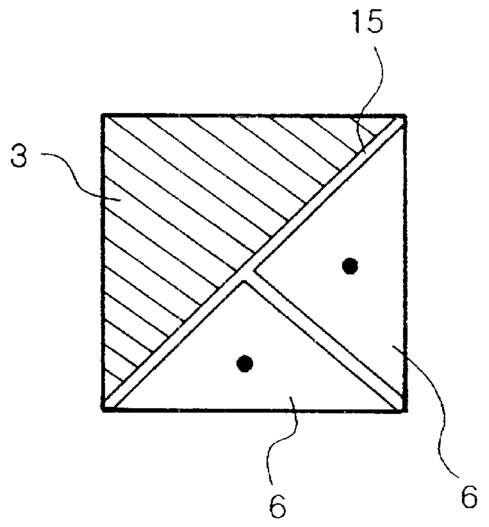
FIGS. 2A and 2B show a plane view of a top and bottom surface of an embodiment of the piezoelectric transformer with multiple outputs in accordance with the present invention.
Figure 2B:
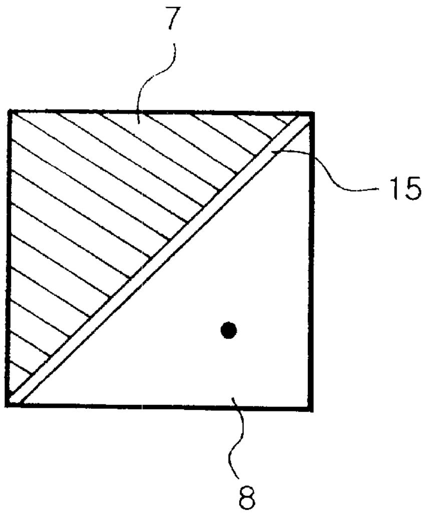

As shown in FIGS. 2A and 2B, a top surface of the square piezoelectric plate 1 is equally divided into two triangles along diagonal line, first of all. A first input electrode 3 is formed on the one triangle. The other triangle is equally divided into the small triangles again. Two first output electrodes 6 are formed on the small triangles respectively.

And a bottom surface of the square piezoelectric plate 1 is divided in the same manners above. Then, a second input electrode 7 and a second output electrode 8 corresponding to the first input electrode 3 and the first output electrode 6 respectively are formed in the same manner above. Namely, the second input electrode 7 and the first input electrode 3 are disposed at a confronting position with respect to the piezoelectric plate 1, and the second output electrode 8 and the first output electrode 6 are disposed at a confronting position with respect to the piezoelectric plate 1.

As shown in FIG. 1, a plurality of first output electrodes 6 divided equally into a plurality of parts on the top surface of the piezoelectric plate 1 are electrically isolated from each other, as well as from the first input electrode 3. And then the plurality of first output electrodes 6 are connected to the terminals 5A of the plurality of fluorescent lamps 4 one to one respectively.

Moreover, the second input electrode 7 is printed in one on a part of bottom surface of the piezoelectric plate 1, and connected to the AC voltage generator 2.

In addition, a second output electrode 8 is printed in one on bottom surface of the piezoelectric plate 1, and is electrically isolated from the second input electrode 7 of the piezoelectric plate 1. And then the second output electrode 8 is connected to the terminal 5B of the plurality of fluorescent lamps 4.

Figure 3A:
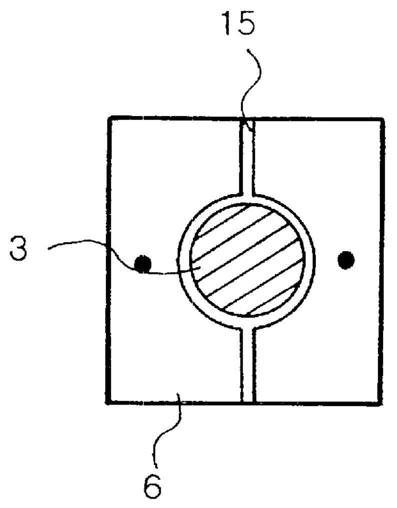
FIGS. 3A and 3B show a plane view of a top and bottom surface of another embodiment of the piezoelectric transformer with multiple outputs in accordance with the present invention.
Figure 3B:
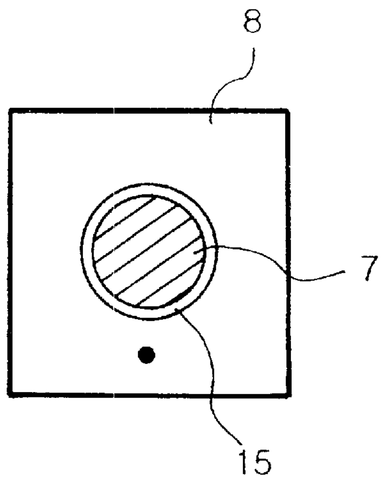

Referring now to FIGS. 3A and 3B, a first input electrode 3 and a second input electrode 7 are formed in a circle on the center of the top surface and bottom surface of a square piezoelectric plate 1 respectively. On the top surface of the square piezoelectric plate 1, two first output electrodes 6 are formed by equally dividing the remaining portions of the top surface of the plate excluding the surface on which the first input electrode 3 is formed. On the bottom surface of the square piezoelectric plate 1, a second output electrode 8 is formed on the remaining portions of the bottom surface of the plate excluding the surface on which the second input electrode 7 is formed.

Figure 4A:
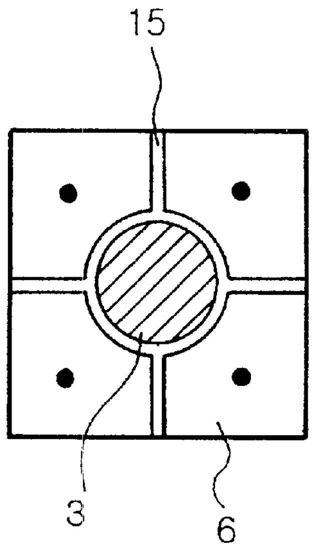
FIGS. 4A and 4B show a plane view of a top and bottom surface of another embodiment of the piezoelectric transformer with multiple outputs in accordance with the present invention.
Figure 4B:
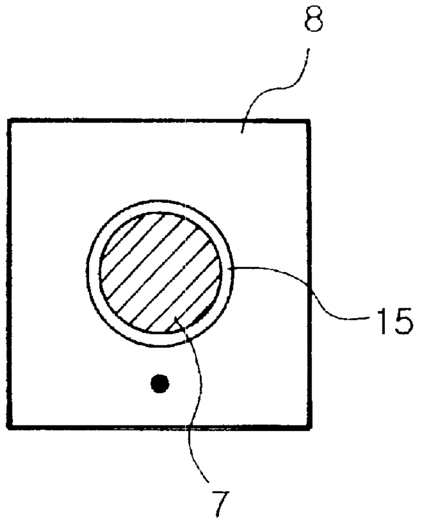

Referring now to FIGS. 4A and 4B, FIGS. 4A and 4B show a plain view of the piezoelectric transformer with multiple outputs connected to four fluorescent lamps. A first input electrode 3 and a second input electrode 7 are formed in a circle on the center of the top surface and bottom surface of a square piezoelectric plate 1 respectively. On the top surface of the square piezoelectric plate 1, four first output electrodes 6 are formed by equally dividing the remaining portions of the top surface of the plate excluding the surface on which the first input electrode 3 is formed into four portions. On the bottom surface of the square piezoelectric plate 1, a second output electrode 8 is formed on the remaining portions of the bottom surface of the plate excluding the second input electrode 7 is formed.

Figure 5A:
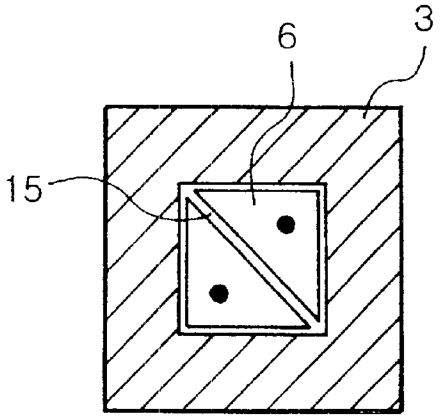
FIGS. 5A and 5B show a plane view of a top and bottom surface of another embodiment of the piezoelectric transformer with multiple outputs in accordance with the present invention.
Figure 5B:
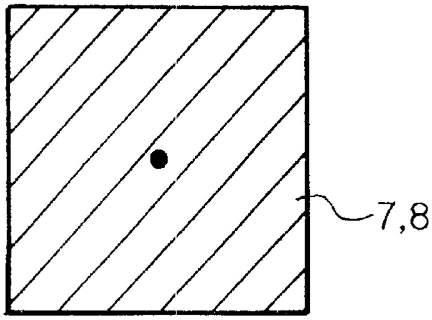
Figure 6:
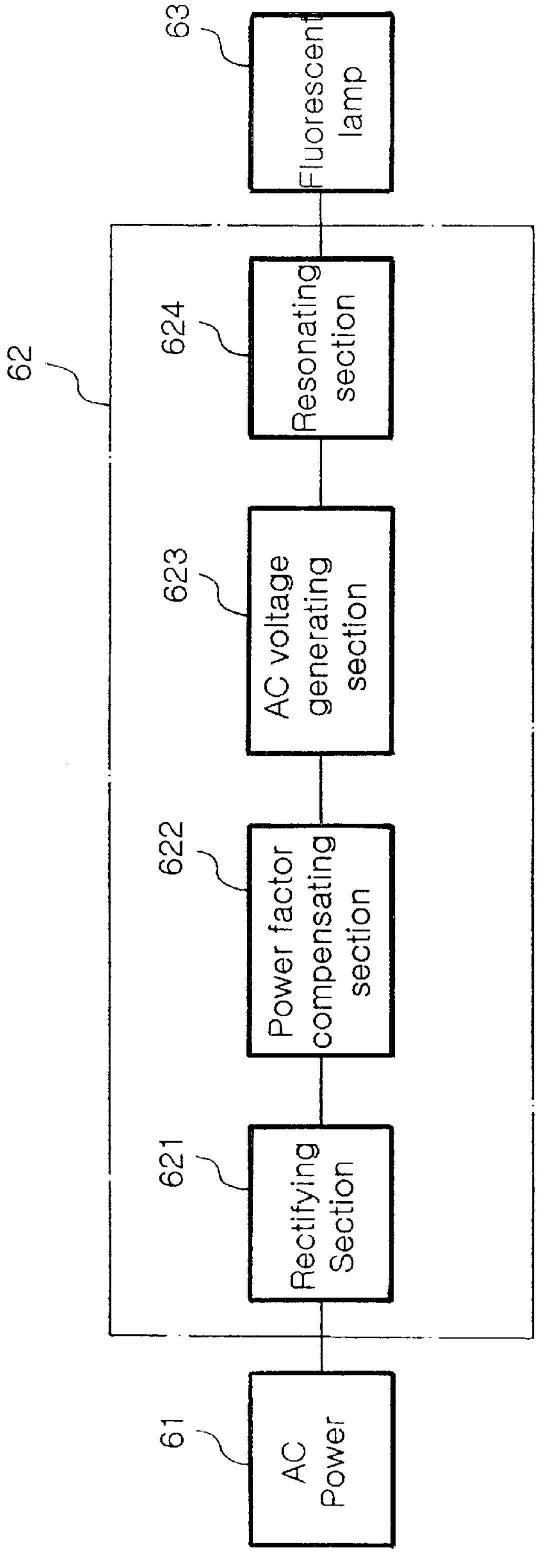
FIG. 6 PRIOR ART
FIG. 6 shows generally a block diagram of configuration of a stabilizer for fluorescent lamp.
Figure 7:
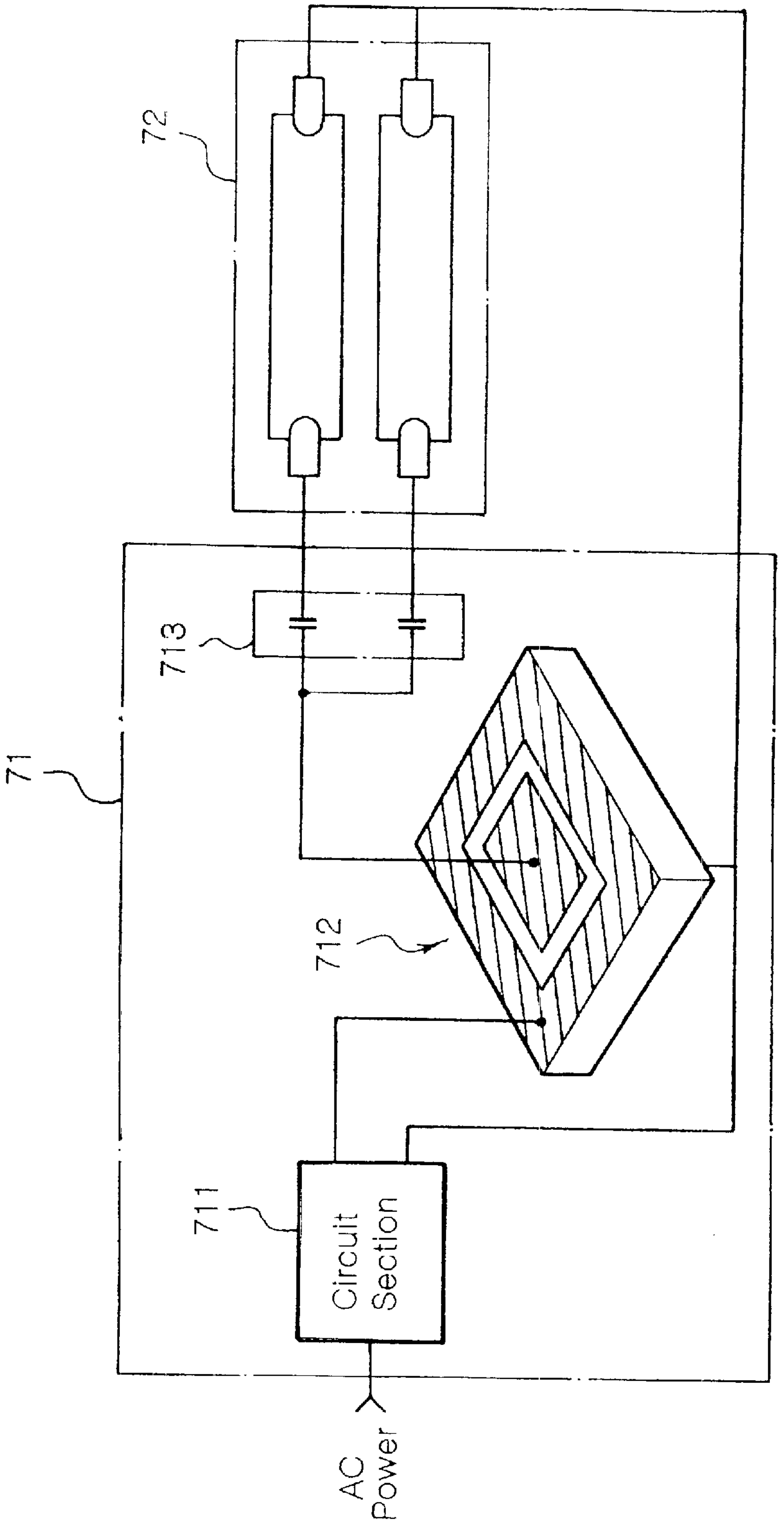
FIG. 7 PRIOR ART
FIG. 7 shows a perspective view of a typical fluorescent lamp stabilizer with a plurality of fluorescent lamps.
Figure 8:
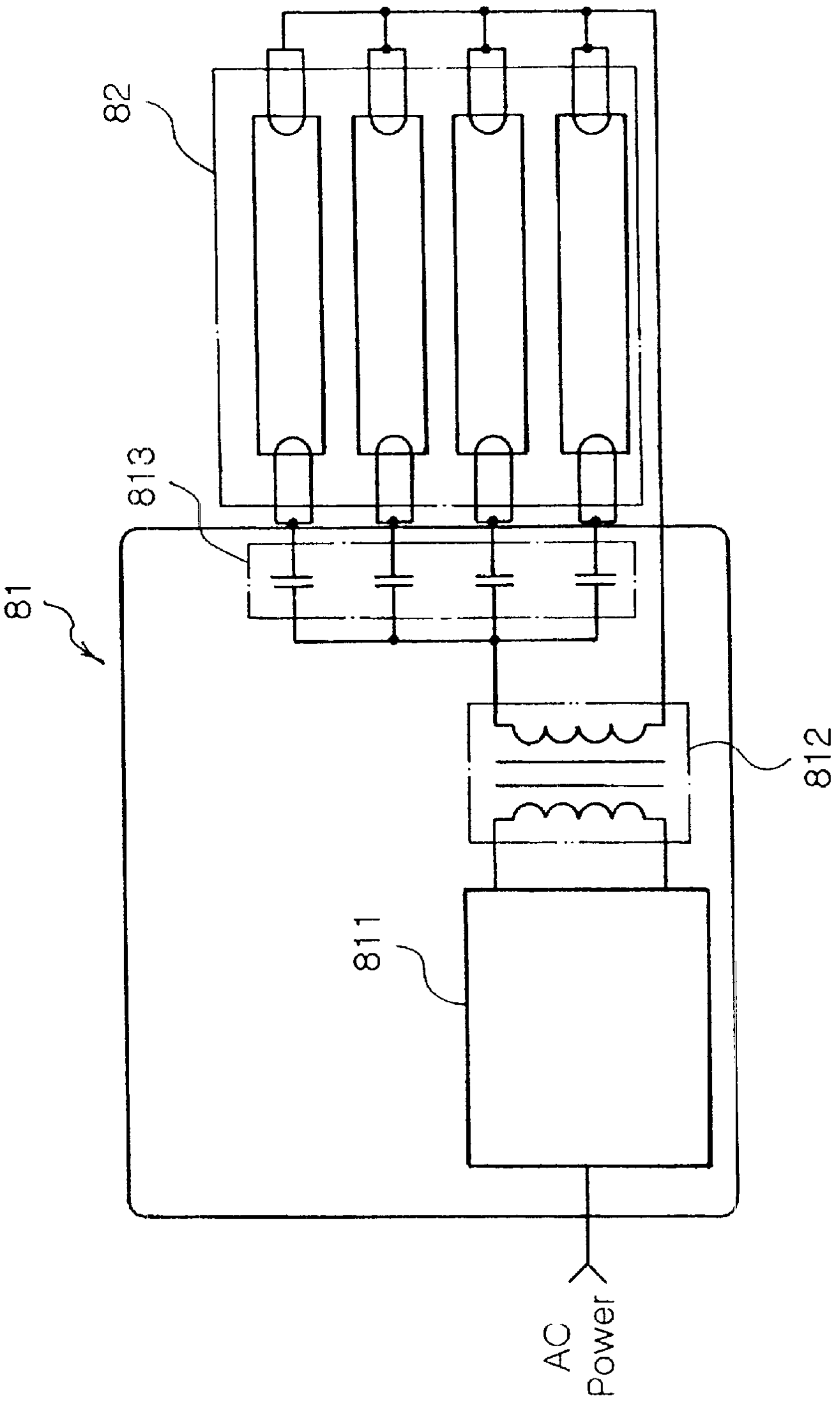
FIG. 8 PRIOR ART
FIG. 8 shows a perspective view of a typical fluorescent lamp stabilizer with a plurality of fluorescent lamps.

Referring now to FIGS. 5A and 5B, FIG. 5A shows a plain view of another embodiment of the piezoelectric transformer with multiple outputs. As shown in the FIG. 5A, first of all, a piezoelectric plate 1 is widely divided into two portions, an inner portion and an outer portion on the top surface of the piezoelectric plate 1. A first input electrode 3 is formed on the outer portion. And the inner portion is equally divided into two small portions again, and the two small portions are electrically isolated from each other. Two first output electrodes 6 are formed on the two small portions respectively.

FIG. 5B shows that a common electrode 7, 8 is formed on the bottom surface of the piezoelectric plate 1, the common electrode 7, 8 being used in common as an electrode.

The present invention offers a piezoelectric transformer with multiple outputs constituting a stabilizer lighting a plurality of fluorescent lamps, which has a high isolating strength and incombustibility because it is made from ceramics. In addition, it has an electrode of the piezoelectric transformer converting a voltage and transferring a power by using the machine vibration. So, it makes a better output characteristic than typical wound-type transformer and typical piezoelectric transformer does.

As shown in the FIGS. 1 to 5, the vibration happens in the direction of its thickness when some AC voltages are supplied to the first input electrode 3 and second input electrodes 7. And then some voltages are outputted via the first output electrode 6 and second output electrode 8 by the vibration.

As shown in the FIG. 1, in case of lighting two fluorescent lamps, the first input electrode 3 and the second input electrodes 7 of the piezoelectric transformer with multiple outputs of the present invention are connected to the output terminal of the circuit section 2 outputting an AC voltage. Each of first output electrode 6 is connected to one terminal of the each fluorescent lamp one to one, and the other terminals of the two fluorescent lamps are connected to the second output electrode 8.

If some AC voltages are supplied to the first input electrode 3 and the second input electrode 7 formed on the top surface and the bottom surface of the piezoelectric plate 1 respectively, the piezoelectric plate 1 vibrates. By the piezoelectric vibration, Some voltages are supplied to two first output electrodes 6 formed on the top surface of the piezoelectric plate 1, which are equally divided into two small portions in order to isolate electrically from the first input electrode 3 by using the open-area 15. Therefore, some AC voltages are supplied to two fluorescent lamps 4 at the same time.

In addition, the second output electrode 8 is also connected to the common terminal of the two fluorescent lamps, which is electrically isolated from the second input electrode 7 by using the open-area 15 on the bottom surface of the piezoelectric plate 1. The open-area 15 formed located in the side of the first input electrode 3 and the second input electrode 7 is formed along the diagonal line on the top surface and the bottom surface of the piezoelectric plate 1. The open-area 15 is also formed in order to divide equally the first output electrode 6 into two small portions.

As shown in FIGS. 3A and 3B, and 4A and 4B, in case of lighting a plurality of fluorescent lamps, if some AC voltages from the circuit section 2 are supplied to the first input electrode 3 and the second input electrode 7 formed on the top surface and the bottom surface of the piezoelectric plate 1 respectively, the piezoelectric plate 1 vibrates. By the piezoelectric vibration, some voltages are supplied to a plurality of first output electrodes 6 formed on the top surface of the piezoelectric plate 1, which are equally divided into a plurality of small portions in order to isolate electrically from the first input electrode 3 by using the open-area 15. Therefore, some AC voltages are supplied to the terminals 5A of the plurality of fluorescent lamps 4 at the same time.

In addition, the second output electrode 8 is also connected to the common terminal of the plurality of fluorescent lamps, which is electrically isolated from the second input electrode 7 by using the open-area 15 on the bottom surface of the piezoelectric plate 1.

Moreover, the first input electrode 3 and the second input electrode 7 are formed in a circle on the top and bottom surface of the piezoelectric plate 1. The open-area 15 located in the outer side of the first input electrode 3 and the second input electrode 7 is formed in common with an open-area dividing the first output electrode 6 into the plurality of small portions. The second output electrode 8 located in the outer side of the second input electrode 7 is formed by using an open-area 15.

As shown in FIGS. 5A and 5B, in case of lighting two fluorescent lamps, if some AC voltages from the circuit section 2 are supplied to the first input electrode 3 and the second input electrode 7 formed on the top and bottom surface of the piezoelectric plate 1 respectively, the piezoelectric plate 1 vibrates. Two first output electrodes 6 formed on the top surface of the piezoelectric plate 1 are connected to the terminal SA of the fluorescent lamps one to one respectively, which is equally divided into two small portions in order to isolate electrically from the first input electrode 3 by using a open-area 15. Therefore, some AC voltages are supplied to the two fluorescent lamps 4 at the same time by the piezoelectric vibration.

In addition, the second output electrode 8 used in common with the second input electrode 7 is connected to the other terminal 5B of the two fluorescent lamps 4. The first input electrode 3 is electrically isolated from the first output electrode 6 by an open-area 15 formed in the first input electrode 3.

By using only one piezoelectric transformer with the characteristic above, it is possible to light a plurality of fluorescent lamps at the same time without typical wound-type transformer or condenser.

Accordingly, it is possible to light a plurality of fluorescent lamps by using the piezoelectric transformer of the present invention without an additional wound-type transformer or ballast condenser. Thus, by providing the piezoelectric transformer with multiple outputs, a reduction in both size and weight may be realized, and a easy working may be also realized. Additionally, by decreasing the number of components, a cost savings is also obtained. Finally, by minimizing a volume of stabilizer, a design restriction of the stabilizer may be lower, and it is not necessary to design about an isolation additionally.

In addition, multiple outputss are easily obtained by applying the piezoelectric transformer of the present invention to a power converting circuit (for example, DC-DC converter, AC-DC converter, DC-AC converter) transmitting a power.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed:

1. A piezoelectric transformer with multiple outputs constituting a stabilizer for fluorescent lamps, comprising:

a piezoelectric plate;

a first input electrode formed on the top surface of said piezoelectric plate;

a second input electrode formed on the bottom surface of said piezoelectric plate, which is disposed at a confronting position of said first input electrode;

a plurality of first output electrodes formed on the equally divided remaining portions of the top surface of said plate excluding the surface on which said first input electrode is formed, which are electrically isolated from each other; and a second output electrode formed on the remaining portions of the bottom surface of said plate excluding the surface on which said second input electrode is formed, which is disposed at the confronting position of said plurality of first output electrodes, wherein the top surface and the bottom surface of said piezoelectric plate are equally divided along the diagonal line respectively, and said first input electrode and said second input electrode are formed on a divided portion of the top surface and the bottom surface of said piezoelectric plate respectively, said plurality of first output electrodes and said second output electrode are formed on the other divided portions of the top surface and bottom surface of said piezoelectric plate respectively.

2. The piezoelectric transformer with multiple outputs of claim 1, wherein said second input electrode and said second output electrode are formed in common by connecting both electrodes.

3. A stabilizer lighting more than two fluorescent lamps at the same time, the stabilizer comprising:

a rectifying section converting an AC commercial supply voltage into DC voltage;

a power factor compensating section compensating the power factor generated by the fluctuation of said AC commercial supply voltage to maintain DC voltage outputted from said rectifying section at a uniform level;

an AC voltage generating section converting a DC voltage inputted from said power factor compensating section to an AC voltage having a predetermined frequency; and a piezoelectric transformer with multiple outputs according to claim 1, wherein the input electrodes receive an AC voltage from said AC voltage generating section, and the output electrodes are connected to said plurality of fluorescent lamps respectively, each electrodes being same size and electrically isolated from each other, whereby the same magnitude voltage is supplied to said fluorescent lamps.

4. A piezoelectric transformer with multiple outputs constituting a stabilizer for fluorescent lamps, comprising:

a square shaped piezoelectric plate;

a first input electrode formed on the outer portion of the top surface of said piezoelectric plate;

a second input electrode formed on the bottom surface of the piezoelectric plate, a plurality of first output electrodes formed on the inner square shaped portion of the top surface of the piezoelectric plate, the first output electrodes are respectively separated from the outer first input electrode; and a second output electrode formed on the bottom surface of said piezoelectric plate.

5. The piezoelectric transformer with multiple outputs according to claim 4, wherein the first output electrodes have two portions formed by dividing the square shaped inner portion along the diagonal line.

* * * * *